(12) United States Patent
Wang (10) Patent No.: US 11,048,845 B1
(45) Date of Patent: Jun. 29, 2021

(54) FPGA CHIP-BASED HANDLER SIMULATION TEST SYSTEM AND A TEST METHOD

(71) Applicant: ACETEC SEMICONDUCTOR CO. LTD., Zhenjiang (CN)

(72) Inventor: Rui Wang, Zhenjiang (CN)

(73) Assignee: ACETEC SEMICONDUCTOR CO. LTD., Zhenjiang (CN)

( * ) Notice: Subject to any disclaimer, the term of this patent is extended or adjusted under 35 U.S.C. 154(b) by 0 days.

(21) Appl. No.: 17/048,612

(22) PCT Filed: Oct. 15, 2019

(86) PCT No.: PCT/CN2019/111128
§ 371 (c)(1),
(2) Date: Oct. 19, 2020

(87) PCT Pub. No.: WO2020/083066
PCT Pub. Date: Apr. 30, 2020

(30) Foreign Application Priority Data

Oct. 22, 2018 (CN) .......................... 201811230200.0

(51) Int. Cl.
*G06F 30/34* (2020.01)
*G01M 13/00* (2019.01)

(52) U.S. Cl.
CPC ............. *G06F 30/34* (2020.01); *G01M 13/00* (2013.01)

(58) Field of Classification Search
CPC ...... G06F 9/455; G06F 11/261; G06F 11/273; G06F 11/2733; G06F 30/331; G06F 30/34
See application file for complete search history.

(56) References Cited

U.S. PATENT DOCUMENTS

| 6,178,526 B1 | 1/2001 | Nguyen et al. |
| 2011/0264435 A1* | 10/2011 | Jamnejad .............. G06F 11/261 703/28 |
| 2014/0281398 A1* | 9/2014 | Rash ....................... G06F 9/382 712/208 |

FOREIGN PATENT DOCUMENTS

| CN | 102183726 A | 9/2011 |
| CN | 103890595 A | 6/2014 |
| CN | 108020401 A | 5/2018 |
| CN | 109144036 A | 1/2019 |
| CN | 209070360 U | 7/2019 |

* cited by examiner

*Primary Examiner* — Rehana Perveen
*Assistant Examiner* — Cuong V Luu
(74) *Attorney, Agent, or Firm* — Bayramoglu Law Offices LLC (57) ABSTRACT

An FPGA chip-based handler simulation test system is provided. The FPGA chip-based handler simulation test system includes a handler simulator, a PC and a tester. The handler simulator includes an FPGA, an RS232 interface, a GPIB interface, a RAM, a LED, a keypad and a soft-core processor. The soft-core processor includes a CPU, an SDRAM, a PIO, a UART and a JTAG. The firmware of the soft-core processor establishes the communication of the RS232 interface and the GPIB interface, as well as the display of the LED and reception of the keypad. The test system of the present invention simulates handler communication by using a small-sized and low-cost hardware circuit, and is easy to carry. In this way, an operator can debug the handler in the laboratory without damaging the handler, thus protecting the expensive handler.

18 Claims, 5 Drawing Sheets

FPGA CHIP-BASED HANDLER SIMULATION TEST SYSTEM AND A TEST METHOD

CROSS REFERENCE TO THE RELATED APPLICATIONS

This application is the national phase entry of International Application No. PCT/CN2019/111128, filed on Oct. 15, 2019, which is based upon and claims priority to Chinese Patent Application No. 201811230200.0, filed on Oct. 22, 2018, the entire contents of which are incorporated herein by reference.

TECHNICAL FIELD

The present invention belongs to the field of handler testing, and more particularly, relates to a field-programmable gate array (FPGA) chip-based handler simulation test system and a test method.

BACKGROUND

Figure 1:
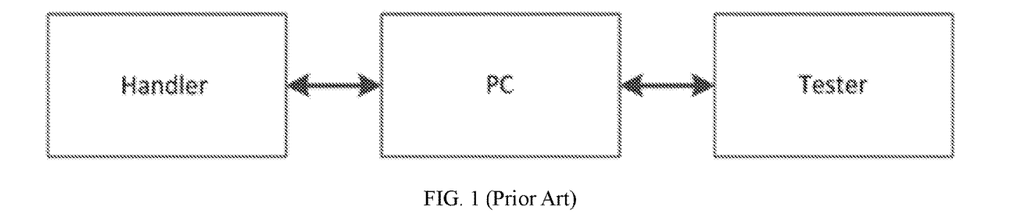
FIG. 1 is a block diagram showing the connection of an existing handler under test.

Handlers are typically used in the automated testing production of chips to improve production efficiency. A tester is used to test the handlers before use. The handler and the tester generally communicate via the recommend standard 232 (RS232) or the general-purpose interface bus (GPIB), and they interact with each other by using a set of special instructions. It is very important that the handler and the tester can accurately deliver the send and receive information to each other (as shown in FIG. 1). When setting up test equipment, it is necessary to debug the test equipment to ensure it can establish proper communication with the handler. Since the handler is bulky and difficult to be transported to a laboratory, engineers routinely need to connect to the handler on site for debugging, which would consume labor, time and cost. Moreover, connecting to handler to debug would sometimes cause misoperation, which may result damage to the expensive handler due to short-circuit or other types of improper operation.

SUMMARY

In view of the shortcomings in the prior art, an objective of the present invention is to provide an FPGA chip-based handler simulation test system and method.

To achieve the above-mentioned objective, the present invention adopts the following technical solutions.

An FPGA chip-based handler simulation test system includes a handler simulator, a personal computer (PC) and a tester. The handler simulator is connected to the PC, and the PC is connected to the tester. The handler simulator includes an FPGA, a recommend standard 232 (RS232) interface, a general-purpose interface bus (GPIB) interface, a random-access memory (RAM), a light-emitting diode (LED), a keypad and a soft-core processor. The soft-core processor includes a central processing unit (CPU), a synchronous dynamic RAM (SDRAM), a parallel input/output (PIO), a universal asynchronous receiver transmitter (UART), and a joint test action group (JTAG) UART. The firmware of the soft-core processor establishes the communication of the RS232 interface and the GPIB interface, as well as the display of the LED and reception of the keypad.

Preferably, the soft-core processor is a NIOS embedded processor, and the soft-core processor uses FPGA logic and memory resources to construct an embedded system of the handler simulator.

Preferably, the memory allocation of the soft-core processor includes a Flash where a reset vector points to the FPGA and an SDRAM where an exception vector points to the peripheral.

Preferably, the PIO interacts with the handler simulator, the keypad and the LED by using a hardware description language (HDL) to establish the GPIB communication of the handler simulator, receive information of the keypad and output a signal of the LED.

Preferably, the communication of the RS232 interface is established by calling the send and receive functions of the UART module in the soft-core processor, and the communication of the GPIB interface is established by the PIO and a three-way handshake process.

Preferably, the model of the FPGA processor is EP4CE6E22C8N, and the RAM is a 64-Mbit SDRAM.

Preferably, the LED is configured to display a communication mode and binning status of the handler. After being received by the firmware via communication, the binning information is output to the outside of the soft-core processor via the PIO of the soft-core processor, and then encoded using the HDL and output to the external LED for display.

Preferably, the keypad includes four dual in-line package (DIP) switches configured to indicate station status, additionally, the keypad further includes a functional button with a reset function and a communication mode selection function. When the DIP switches are turned on, it indicates that the corresponding station is ready. The functional button is configured to reset, when it is been slightly touched, and a long press on the function button will switch the communication mode.

Preferably, a counter in the FPGA process the signals of the functional button. The counter does not reach its counter value when the functional button is just slightly touched, which causes a reset signal to be sent directly to the soft-core processor for a reset operation. When the functional button is pressed for a long time, the count value of the counter is reached, which results a mode switching signal, instead of the reset signal, to be sent to the soft-core processor via the PIO to switch the communication mode.

A test method for the FPGA chip-based handler simulation test system, including:

1) sending an enquiry (ENQ) command to the handler simulator by the PC; the command is an enquiry, and a response is sent to verify the existence of the handler simulator after the ENQ command is received;

2) returning an acknowledgement (ACK) response command by the handler simulator after the handler simulator receives the ENQ command to verify the existence of the handler simulator;

3) sending a start test command by the PC after the PC receives the ACK;

4) sending an ENQ to the PC by the handler simulator after the handler simulator receives the start test command, and then sending the ACK response by the PC;

5) after the response is received, sending a station-ready command by the handler simulator to indicate the number of stations of the handler simulator that have been ready for testing;

6) after the PC receives station-ready information, informing the tester by the PC to perform the testing on the corresponding station; and 7) after the testing is completed, sending an enquiry by the PC, after the handler simulator responds, sending binning information by the PC, and performing a corresponding binning operation by the handler.

Compared with the prior art, the present invention has the following advantages:

The FPGA chip-based handler simulation test system of the present invention simulates handler communication by using a small-sized and low-cost hardware circuit, represents all communication operations of the handler, and is easy to carry. In this way, an operator can debug the handler in the laboratory to make full preparation for entering the production line debugging stage. Moreover, a misoperation performed during the debugging process would only cause damage to the simulator, rather than to the handler. Thus, the FPGA chip-based handler simulation test system protects the expensive handler and saves costs that are associated with the handler production line debugging process. Additionally, the FPGA chip-based handler simulation test system of the present invention has the capacity to handle almost all types of handler communication on the market as it is configured to have both RS232 and GPIB interface functions.

DETAILED DESCRIPTION OF THE EMBODIMENTS

The present invention will be further described below with reference to the drawings. The specific embodiments are implemented based on the technical solution of the present invention. It should be understood that these embodiments are only used to illustrate the present invention rather than to limit the scope of the present invention.

Figure 2:
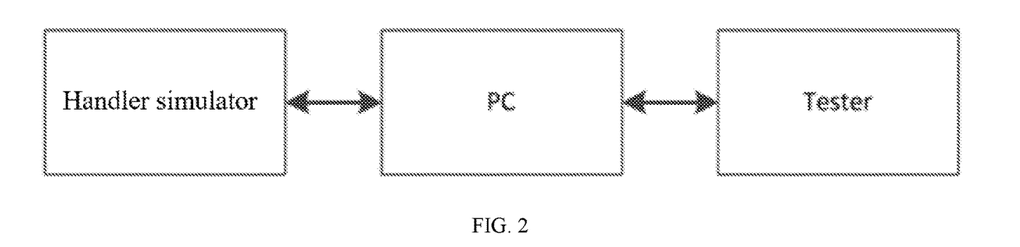
FIG. 2 is a block diagram showing the connection of the FPGA chip-based handler simulation test system.
Figure 3:
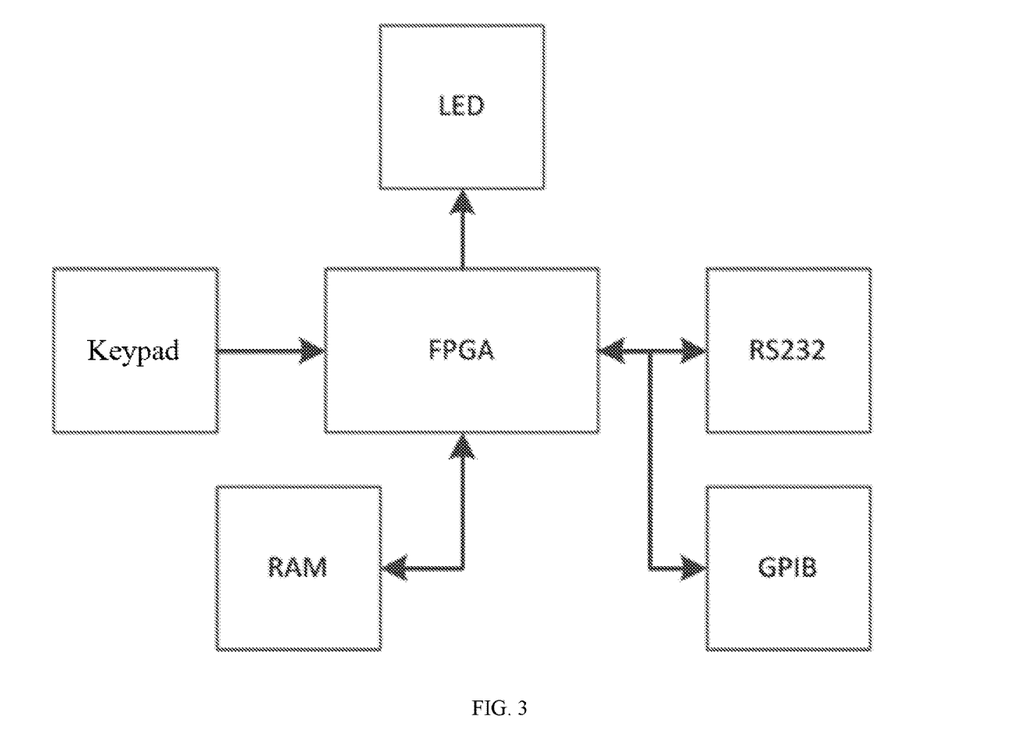
FIG. 3 is a structural block diagram showing the handler simulator of the FPGA chip-based handler simulation test system.

As shown in FIG. 2, an FPGA chip-based handler simulation test system of the present invention includes a handler simulator, a PC and a tester. The handler simulator is connected to the PC, and the PC is connected to the tester. The hardware of the handler simulator mainly includes an FPGA, an RS232 interface, a GPIB interface, a RAM, a LED and a keypad. The FPGA uses Altera EP4CE6E22C8N and has the advantages of large capacity and low cost. The RANI uses a 64-Mbit SDRAM. The RS232 serial port chip uses SP3232. The GPIB is implemented using a general interface of the FPGA. An external 5V transformer is used for supplying power. The software architecture of the present invention is a soft-core processor, which includes a CPU, an SDRAM, a PIO, a UART and a JTAG. The firmware of the soft-core processor establishes the communication of the RS232 interface and the GPIB interface, as well as the display of the LED and reception of the keypad.

The soft-core processor is a NIOS embedded processor, and the soft-core processor uses FPGA logic and memory resources to construct an embedded system of the handler simulator. For the convenience of implementation, the present technical solution is implemented using NIOS II of the FPGA. NIOS II is a soft-core processor of an Altera FPGA. The development of NIOS II includes two steps: soft core design and firmware programming.

Figure 4:
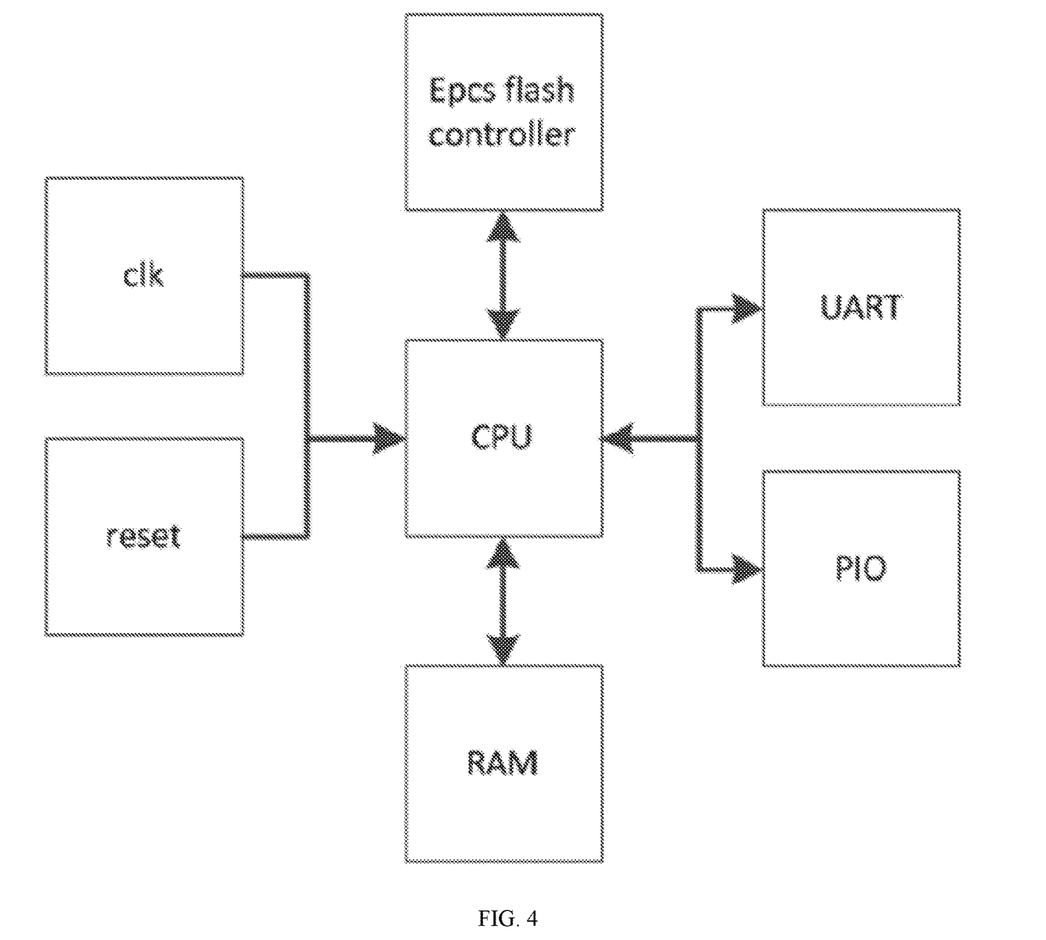
FIG. 4 is a structural diagram showing a soft-core processor of the FPGA chip-based handler simulation test system.

Specifically, the design of the soft core includes a CPU as the processor, an SDRAM and epcs_flash_controller for memories and memory controller, a PIO for peripherals, a UART and JTAG UART for interface protocols into the soft core, such as setting the clock (CLK) and reset, setting the CPU type in the CPU. The CPU type is selected according to functional requirements, a low-level CPU has fewer functions and takes up fewer resources. In the present invention, the CPU of the lowest level is sufficient. Besides, the memory needs to be allocated. The memory allocation of the soft-core processor includes a Flash where a reset vector points to the FPGA, and a RANI where an exception vector points to the hardware of the handler simulator. The baud rate and data bits are mainly set in the UART. As the synchronization level increases, the baud rate becomes more stable. In the present invention, the baud rate of the UART is set to 19200, and the bit width is set to 8.

The PIO uses the HDL for interaction, and the PIO is a pin configured for general interaction with the HDL. The bit width and signal direction can be set for the PIO, and the PIO can be used for triggering an interrupt. The main function of the PIO herein is to establish the GPIB communication of the handler simulator, and to receive information of the keypad and output a signal of the LED. After all modules are added, base addresses and interrupt numbers are automatically assigned by using system/assign base address and assign interrupt numbers to avoid errors. The JTAG UART is a serial communication interface between the PC and the Nios II system. FIG. 4 schematically shows the structure of the generated soft core.

The design of the firmware of the soft core uses the NIOS II integrated development environment (IDE), which is a dedicated embedded design tool of Altera. The firmware mainly establishes the communication of the RS232 and the GPIB, as well as the display of the LED and reception of the keypad.

Figure 5:
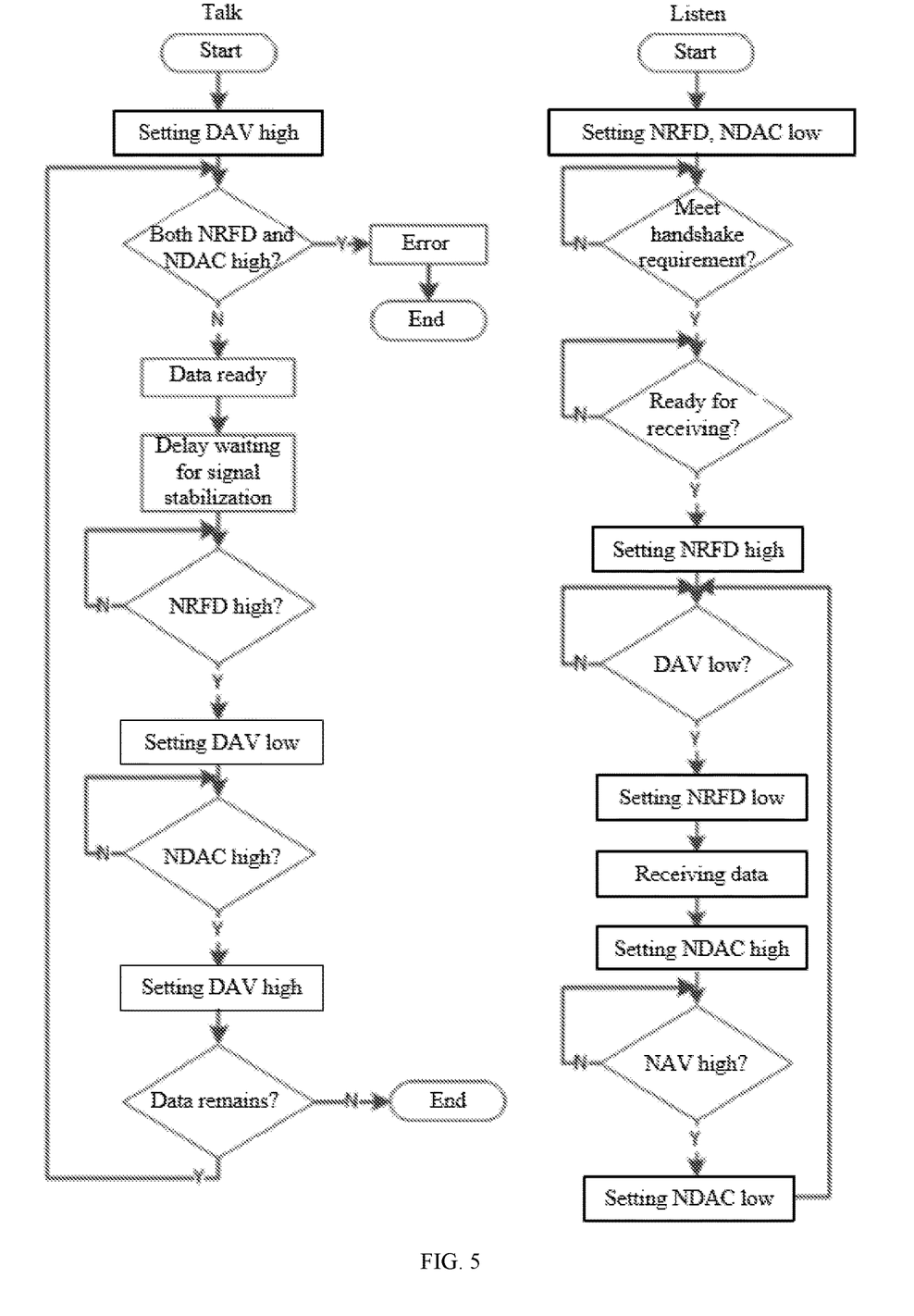
FIG. 5 is a flow chart showing the three-way handshake process of the FPGA chip-based handler simulation test system.

The communication of the RS232 interface is established by calling the send and receive functions of the UART module in the soft-core processor, and the communication of the GPIB interface is established by the PIO and a three-way handshake process. Interrupts are used when implementing RS232 reception. When the interrupt conditions are met, for example, when an edge is detected after the UART data arrives, the program immediately jumps to the interrupt subroutine. The data is then stored. The GPIB can only be implemented by firmware because it does not have any ready-made modules in the soft core. The PIO is configured as several signals of the GPIB: Data Valid (DAV), Not Ready For Data (NRFD), Not Data Accepted (NDAC), D [7:0]. The listen-talk three-way handshake process is implemented by programming to establish the communication function of the GPIB interface. FIG. 5 schematically shows the three-way handshake process. In the present invention, the identity of the PC includes a controller/talker/listener, and the identity of the handler simulator includes the talker/listener. The PC and the handler simulator perform two-way communication in real time.

DAV stands for a data valid line. When valid data appears on the data line, the talker sets this line as "low" (negative logic), indicating that the listener receives data from the data line.

NRFD stands for a not ready for data line. The line stays "low" unless every listener is ready for receiving data, indicating that the talker should not send a message for now.

NDAC stands for a not data accepted line. The line stays "low" unless every listener finishes receiving data from the data bus, indicating that the talker should not remove the information on the data bus.

The LED is configured to display the communication mode and the binning status of the handler. The communication mode includes RS232 and GPIB. After being received by the firmware via communication, the binning information is output to the outside of the soft core via the PIO of the soft-core processor, and then encoded using the HDL and output to the external LED for display.

The keypad includes four DIP switches configured to indicate station status and a functional button with a reset function and a communication mode selection function. The functional button is slightly touched to reset, and a long press on the functional button will switch the communication mode. The DIP switch is configured to indicate the ready status of the handler station, whereby the ready information of the station is determined during communication. In the present invention, four DIP switches are arranged and configured to indicate stations 1 to 4, respectively. The DIP switch being turned on indicates that the corresponding station is ready.

The number of the functional button is 1. The functional button has a reset function and a communication mode selection function. The functional button is slightly touched to reset and long pressed to switch mode. The signal of the functional keypad is processed by the counter in the FPGA. When the functional button is slightly touched, the count value of the counter is not reached, and then a reset signal is sent directly to the soft-core processor for a reset operation. When the functional button is long pressed, the count value of the counter is reached, and then a mode switching signal instead of the reset signal is sent to the soft-core processor via the PIO to switch the communication mode.

Figure 6:
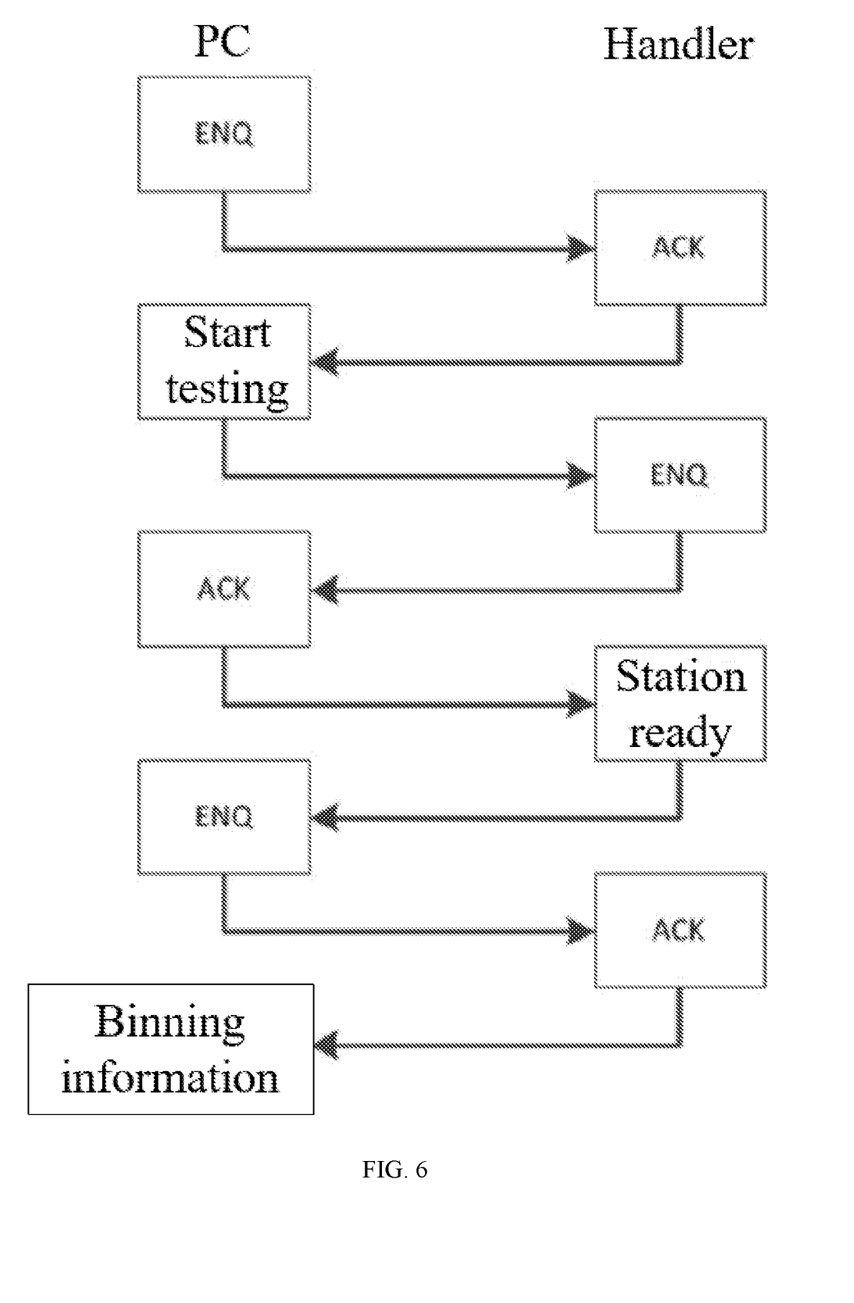
FIG. 6 is a flow chart showing the actual communication of the handler NX16EX250.

Taking the handler with the model NX16EX250 as an example, FIG. 6 schematically shows the actual communication process between the handler and the PC. The command to start the test is CE, and the command for the binning information is BA. Except for a single byte, multiple bytes must be wrapped with start and end characters, which are Start-of-Text (STX) character and End-of-Text (ETX) character, respectively. The hexadecimal code corresponding to each command can be acquired by consulting the handler's manual, programming is conducted in the firmware according to the procedure, and a response to the corresponding PC signal is generated to simulate the handler operation, which is the same communication process for RS232 or GPIB. The test process is specifically as follows.

1) The PC sends an ENQ command to the handler; the command is an enquiry, and a response is sent to verify the existence of the handler after the ENQ command is received.

2) The handler returns an ACK response command after receiving the ENQ command, to verify the existence of the handler.

3) The PC sends a start test command after receiving the ACK.

4) The handler sends an ENQ to the PC after receiving the start test command, and then the PC sends the ACK response.

5) After the response is received, the handler sends a station-ready command to indicate the number of stations of the handler that have been ready for testing.

6) After receiving station-ready information, the PC informs the tester to perform testing on the corresponding station.

7) After the testing is completed, the PC sends an enquiry; after the handler responds, the PC sends binning information, and the handler performs a corresponding binning operation.

Figure 7:
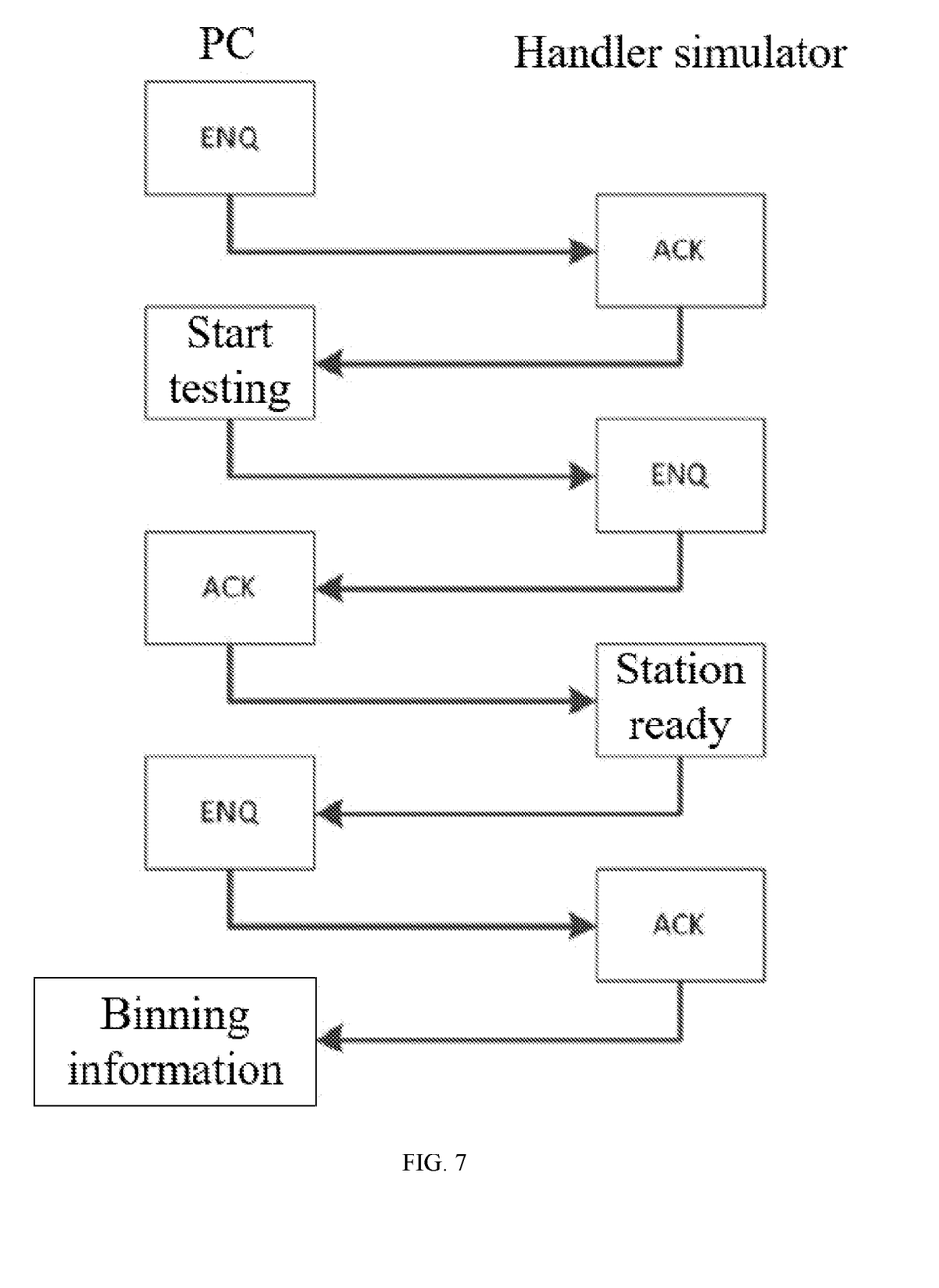
FIG. 7 is a flow chart showing an example of the test process of the handler simulator of the FPGA chip-based handler simulation test system.

In the present invention, the testing of a handler at the debugging stage is performed to a handler simulator instead of the handler itself. Therefore, tester and PC that are used for testing would not need to be carried to the site where the handler physically located just to be connected to the handler, and reduces the likelihood of damaging the handler due to misoperation. The handler simulator of the present invention can simulate different types of handlers, and the test process of the handler simulator is specifically as follows.

1) The PC sends an ENQ command to the handler simulator; the command is an enquiry, and a response is sent to verify the existence of the handler after the ENQ command is received.

2) The handler simulator returns an ACK response command after receiving the ENQ command, to verify the existence of the handler.

3) The PC sends a start test command after receiving the ACK.

4) The handler simulator sends an ENQ to the PC after receiving the start test command, and then the PC sends the ACK response.

5) After the response is received, the handler simulator sends a station-ready command to indicate the number of stations of the handler simulator that have been ready for testing.

6) After receiving station-ready information, the PC informs the tester to perform testing on the corresponding station.

7) After the testing is completed, the PC sends an enquiry; after the handler simulator responds, the PC sends binning information, and the handler performs a corresponding binning operation.

What is claimed is:

1. An FPGA chip-based handler simulation test system, comprising a handler simulator, a PC and a tester; wherein
the handler simulator is connected to the PC, and the PC is connected to the tester;
the handler simulator comprises an FPGA, an RS232 interface, a GPIB interface, a RAM, a LED, a keypad and a soft-core processor;
the soft-core processor comprises a CPU, an SDRAM, a PIO, a UART and a JTAG UART; a firmware of the soft-core processor establishes a communication of the RS232 interface and the GPIB interface, and the firmware of the soft-core processor establishes a display of the LED and a reception of the keypad.

2. The FPGA chip-based handler simulation test system according to claim 1, wherein
the soft-core processor is a NIOS embedded processor, and the soft-core processor uses FPGA logic and memories to construct an embedded system of the handler simulator.

3. The FPGA chip-based handler simulation test system according to claim 1, wherein
a memory allocation of the soft-core processor comprises a Flash memory and an RAM; wherein a reset vector in the Flash memory points to the FPGA, and an exception vector in the RANI points to the handler simulator.

4. The FPGA chip-based handler simulation test system according to claim 1, wherein
the PIO interacts with the handler simulator, the keypad and the LED by using an HDL to establish a GPIB communication of the handler simulator, receive information of the keypad and output a signal of the LED.

5. The FPGA chip-based handler simulation test system according to claim 1, wherein
the communication of the RS232 interface is established by calling send and receive functions of the UART in the soft-core processor, and the communication of the GPIB interface is established by the PIO and a three-way handshake process.

6. The FPGA chip-based handler simulation test system according to claim 1, wherein
a model of a processor of the FPGA is EP4CE6E22C8N, and the RAM is a 64-Mbit SDRAM memory.

7. The FPGA chip-based handler simulation test system according to claim 1, wherein
the LED is configured to display a communication mode and a binning status of the handler simulator; after being received by the firmware via a communication, binning information is output to an outside of the soft-core processor via the PIO of the soft-core processor, and then encoded using an HDL and output to the LED for the display.

8. The FPGA chip-based handler simulation test system according to claim 1, wherein
the keypad comprises four DIP switches and a functional button; wherein the four DIP switches are configured to indicate a station status and the functional button has a reset function and a communication mode selection function;
each DIP switch of the four DIP switches being turned on indicates that a station corresponding to the each DIP switch is ready; and
the functional button is slightly touched to reset the handler simulator, and the functional button is long pressed to switch a communication mode of the handler simulator.

9. The FPGA chip-based handler simulation test system according to claim 8, wherein
a signal of the functional button is processed by a counter in the FPGA;
when the functional button is slightly touched, a count value of the counter is not reached, and then a reset signal is sent directly to the soft-core processor for a reset operation; and
when the functional button is long pressed, the count value of the counter is reached, and then a mode switching signal instead of the reset signal is sent to the soft-core processor via the PIO to switch the communication mode.

10. A test method for the FPGA chip-based handler simulation test system according to claim 1, comprising:
1) sending a first ENQ command to the handler simulator by the PC; wherein the first ENQ command is a first enquiry, and a response is sent to verify an existence of the handler simulator after the first ENQ command is received;
2) returning a first ACK response command by the handler simulator after the handler simulator receives the first ENQ command, to verify the existence of the handler simulator;

3) sending a start test command by the PC after the PC receives the first ACK response command;
4) sending a second ENQ command to the PC by the handler simulator after the handler simulator receives the start test command, and then sending a second ACK response command by the PC;
5) after the second ACK response command is received, sending a station-ready command by the handler simulator, to indicate a number of stations of the handler simulator, wherein the stations of the handler simulator have been ready for a testing;
6) after the PC receives station-ready information, informing the tester by the PC to perform the testing on the stations corresponding to the station-ready information; and
7) after the testing is completed, sending a second enquiry by the PC; after the handler simulator responds, sending binning information by the PC, and performing a binning operation corresponding to the binning information by the handler simulator.

11. The test method according to claim 10, wherein
the soft-core processor is a NIOS embedded processor, and the soft-core processor uses FPGA logic and memories to construct an embedded system of the handler simulator.

12. The test method according to claim 10, wherein
a memory allocation of the soft-core processor comprises a Flash memory and an RAM; wherein a reset vector in the Flash memory points to the FPGA, and an exception vector in the RAM points to the handler simulator.

13. The test method according to claim 10, wherein
the PIO interacts with the handler simulator, the keypad and the LED by using an HDL to establish a GPIB communication of the handler simulator, receive information of the keypad and output a signal of the LED.

14. The test method according to claim 10, wherein
the communication of the RS232 interface is established by calling send and receive functions of the UART in the soft-core processor, and the communication of the GPIB interface is established by the PIO and a three-way handshake process.

15. The test method according to claim 10, wherein
a model of a processor of the FPGA is EP4CE6E22C8N, and the RAM is a 64-Mbit SDRAM memory.

16. The test method according to claim 10, wherein
the LED is configured to display a communication mode and a binning status of the handler simulator; after being received by the firmware via a communication, binning information is output to an outside of the soft-core processor via the PIO of the soft-core processor, and then encoded using an HDL and output to the LED for the display.

17. The test method according to claim 10, wherein
the keypad comprises four DIP switches and a functional button; wherein the four DIP switches are configured to indicate a station status and the functional button has a reset function and a communication mode selection function;
each DIP switch of the four DIP switches being turned on indicates that a station corresponding to the each DIP switch is ready; and
the functional button is slightly touched to reset the handler simulator, and the functional button is long pressed to switch a communication mode of the handler simulator.

18. The test method according to claim 17, wherein
a signal of the functional button is processed by a counter in the FPGA;
when the functional button is slightly touched, a count value of the counter is not reached, and then a reset signal is sent directly to the soft-core processor for a reset operation; and
when the functional button is long pressed, the count value of the counter is reached, and then a mode switching signal instead of the reset signal is sent to the soft-core processor via the PIO to switch the communication mode.

* * * * *